(12) United States Patent
Bobowick et al.

(10) Patent No.: US 6,271,476 B1
(45) Date of Patent: Aug. 7, 2001

(54) BEND RADIUS GUIDE

(75) Inventors: Derek R. Bobowick, Sandy Hook; Thomas Scanzillo, Trumbull, both of CT (US)

(73) Assignee: The Siemon Company, Watertown, CT (US)

( * ) Notice: Subject to any disclaimer, the term of this patent is extended or adjusted under 35 U.S.C. 154(b) by 0 days.

(21) Appl. No.: 09/460,270

(22) Filed: Dec. 13, 1999

(51) Int. Cl.[7] .................................................... H01B 7/00
(52) U.S. Cl. .............................. 174/135; 174/59; 385/134
(58) Field of Search ........................... 174/59, 135, 74 R, 174/84 R; 385/134, 135, 136; 248/49, 51, 53

(56) References Cited

U.S. PATENT DOCUMENTS

| D. 387,652 | 12/1997 | Carlson, Jr. . | |
|---|---|---|---|
| 5,694,511 | * 12/1997 | Pimpinella et al. | 385/134 |
| 5,758,004 | * 5/1998 | Alarcun et al. | 385/135 |
| 5,806,140 | 9/1998 | Carlson et al. . | |
| 5,898,129 | 4/1999 | Ott et al. . | |
| 5,921,402 | * 7/1999 | Magenheimer | 248/49 X |
| 5,945,633 | 8/1999 | Ott et al. . | |
| 6,012,683 | * 1/2000 | Howell | 248/51 X |
| 6,023,024 | * 2/2000 | Stjerneby | 174/95 |
| 6,076,779 | * 6/2000 | Johnson | 248/49 |

* cited by examiner

*Primary Examiner*—Dean A. Reichard
*Assistant Examiner*—Dhiru R Patel
(74) *Attorney, Agent, or Firm*—Cantor Colburn LLP

(57) ABSTRACT

A bend radius guide provides effective cable management and bend radius control to prevent microbending of fiber optic cables entering and exiting cable distribution enclosures. Using arcuate surfaces, the guide provides bend radius control to prevent against microbending at distribution enclosure openings in directions horizontal or vertical to the enclosure depending upon the placement of the guide. When used in conjunction, bend radius guides prevent microbending in both horizontal and vertical directions concurrently. Bend radius guides used in conjunction can manage a number of fiber cables while still allowing access to individual cables through an angled slot formed by the joining of two guides.

17 Claims, 8 Drawing Sheets

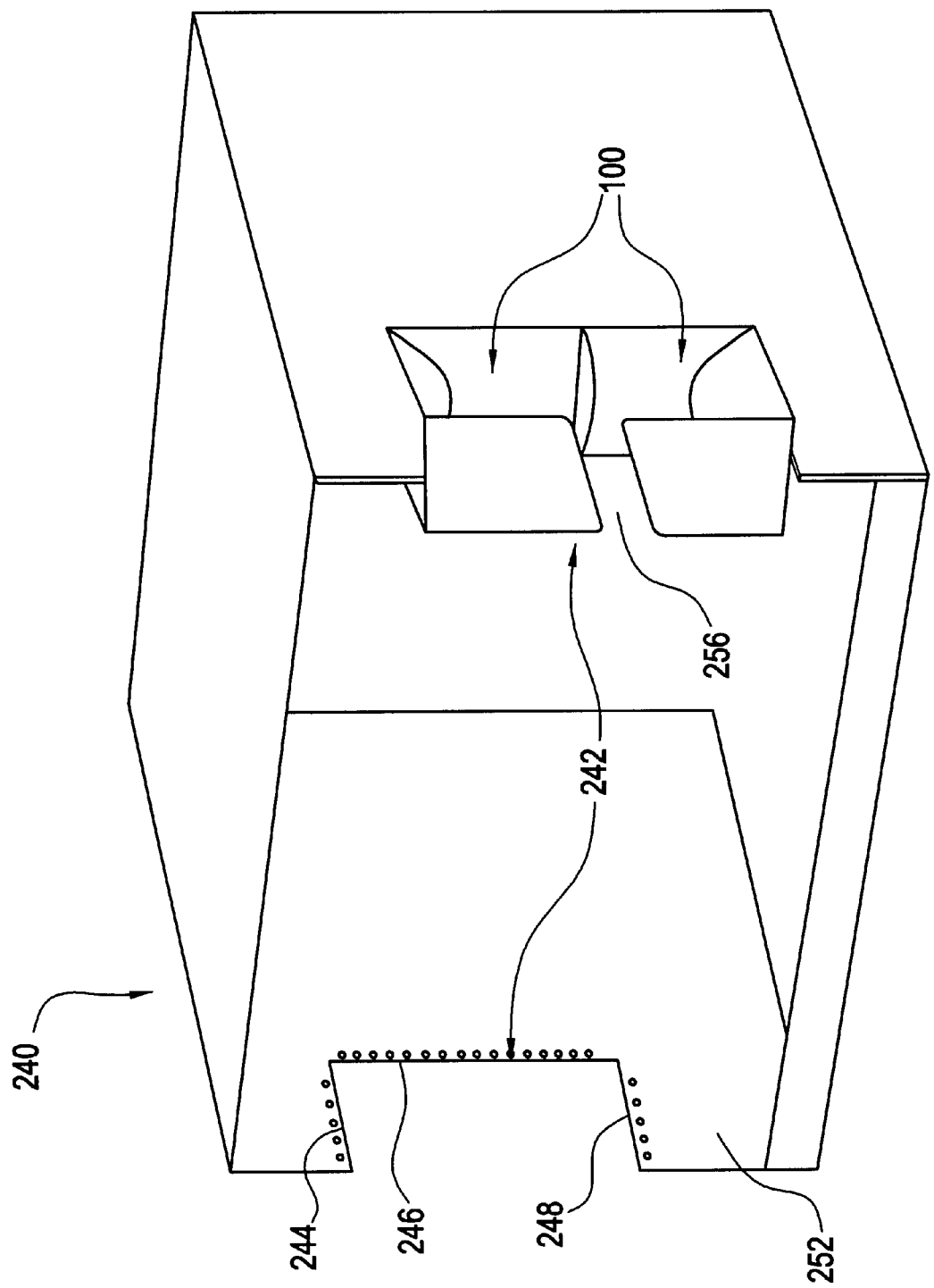

BEND RADIUS GUIDE

BACKGROUND OF THE INVENTION

The invention relates generally to fiber optic cable distribution enclosures and, in particular, a device providing bend radius control of fiber optic cable entering and exiting said enclosures.

Fiber optical cable allows for high data transmission rates over long distances but its usage is limited by a minimum bend radius. It is desirable to control the radius of the fiber optic cable to prevent the fiber from being bent beyond the minimum bend radius. In addition, it is desirable to eliminate microbending, which occurs, for example, when a fiber optical cable is pulled over a sharp corner. Microbending results in unacceptable high attenuation of the optical signal and degrade or interrupt signal transmission.

Fiber optic cable that is brought into a building for use in transmitting coded or modulated signals, such as telephone (voice), cable (video), or computers (data) signals, must be distributed throughout the building to each location that requires access to the information being transmitted. To facilitate that distribution, an enclosure is typically utilized to house and manage the dispersal of the fiber. FIG. 1 shows an example of such a distribution enclosure 10, which is described fully in U.S. Pat. No. 5,945,633, and is incorporated herein by reference. Distribution enclosure 10 allows cables to enter and exit the enclosure at openings 12. In many cases, as many as 72 fibers are distributed within a single enclosure and several of these enclosures are attached to a rack. In larger systems, a room full of these racks serves as a central hub from which thousands of fibers are distributed.

The multitude of fibers entering and exiting distribution enclosures and the proximity of hardware equipment in a fiber optic cable distribution system, such as described above, result in a high incidence of microbending. Any fiber entering or exiting an enclosure can be subject to microbending by being pulled tight across a sharp edge or pinched between two pieces of hard plastic or sheet metal. The improper functioning caused by the microbending of fibers entering or exiting a distribution enclosure degrades the operability of the entire distribution system.

Prior art devices have been used to protect fiber optic cable from sharp surfaces. A rotatable grommet, shown generally at 20 in FIG. 2 and described fully in U.S. Pat. No. 5,806,140, incorporated herein by reference, is designed for opening or closing access to a distribution panel opening 12 through which fiber optic cable travels. The rotatable grommet 20 protects the fiber optic cable from a sharp edge of the enclosure 10 but does not substantially control the bend radius of the fiber optic cable. Although the device of FIG. 2 is well suited for its intended purpose, it is understood that improvements in the control of fiber optic cable bend radius is needed.

SUMMARY OF THE INVENTION

The above-discussed and other drawbacks and deficiencies of prior art are overcome or alleviated by the bend radius guide of the present invention. The bend radius guide provides effective cable management and bend radius control to prevent microbending of fiber optic cables entering and exiting cable distribution enclosures. Using arcuate surfaces, the guide protects fiber optic cable against microbending at distribution enclosure openings in directions horizontal or vertical to the enclosure depending upon the placement of the guide. When used in conjunction, bend radius guides prevent microbending in both horizontal and vertical directions concurrently. Bend radius guides used in conjunction can protect numerous fiber optic cables while still allowing access to individual cables through an angled slot formed by the joining of two guides.

The bend radius guide requires no tools or fasteners for installation. The secure installation of this device is achieved through a snap on fit between an undercut in the device and raised dimples on the enclosure walls. The bend radius guide has a universal design, allowing installation in any cutout (front or back, left or right, top or bottom) on a variety of cable distribution enclosures.

BRIEF DESCRIPTION OF THE DRAWINGS

Referring now to the drawings wherein like elements are numbered alike in the several FIGURES:

FIG. 8 is a perspective view of two bend radius guides installed concurrently on an exemplary cable distribution enclosure.

DETAILED DESCRIPTION OF THE PREFERRED EMBODIMENTS

Figure 1:
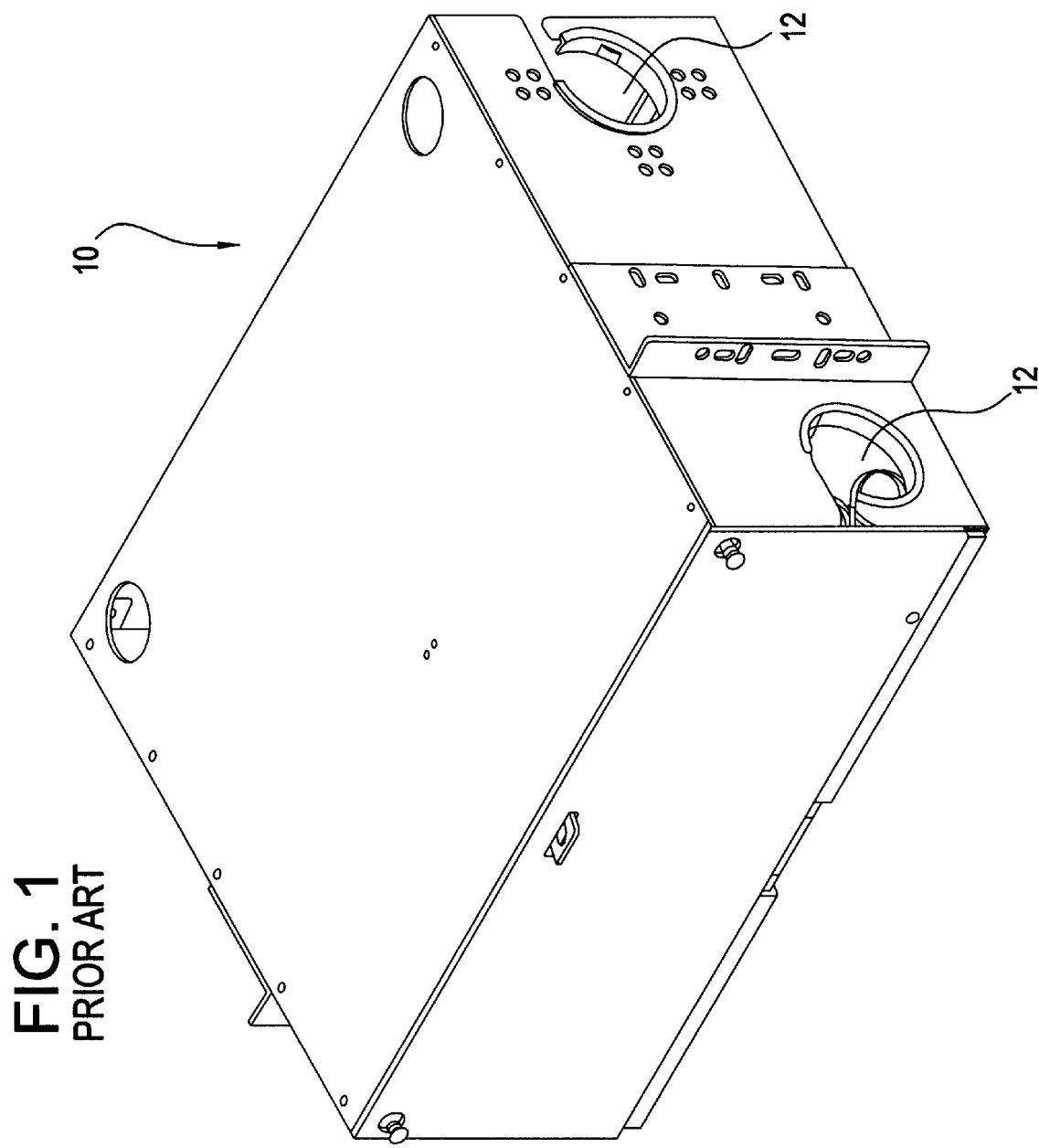
FIG. 1 is a perspective view of a conventional cable distribution enclosure.
Figure 2:
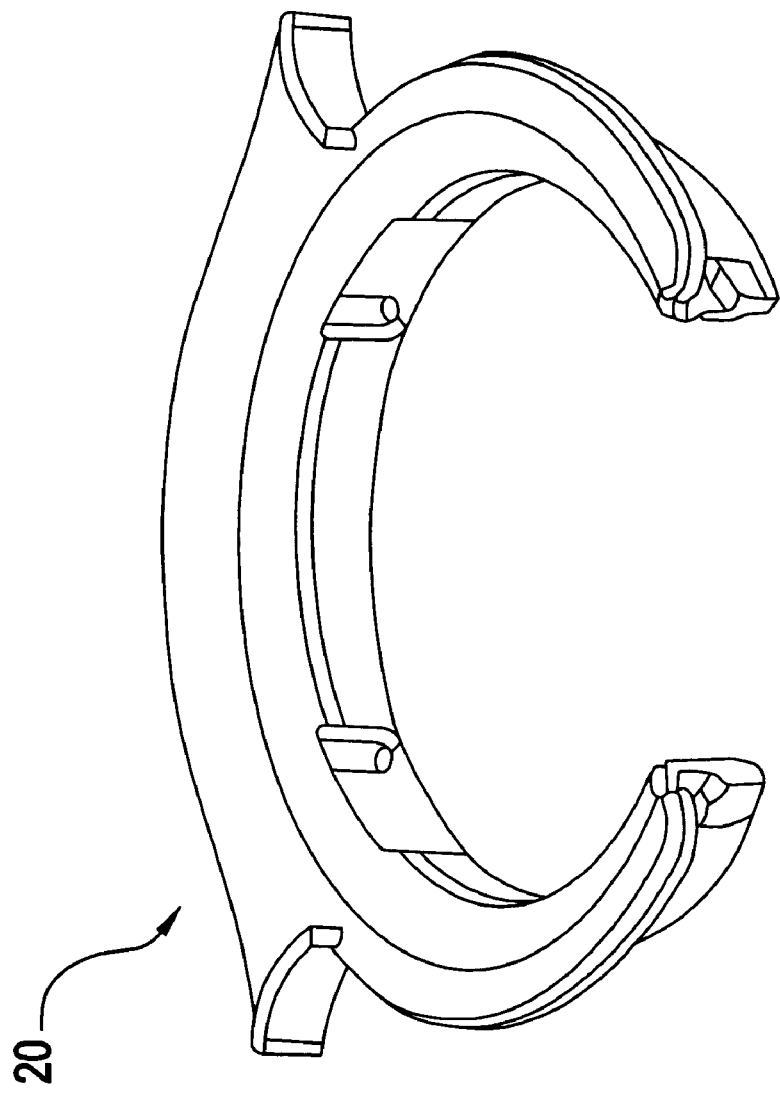
FIG. 2 is a perspective view of a conventional rotatable grommet for opening and closing access to the cable entrance or exit of a cable distribution enclosure.
Figure 3:
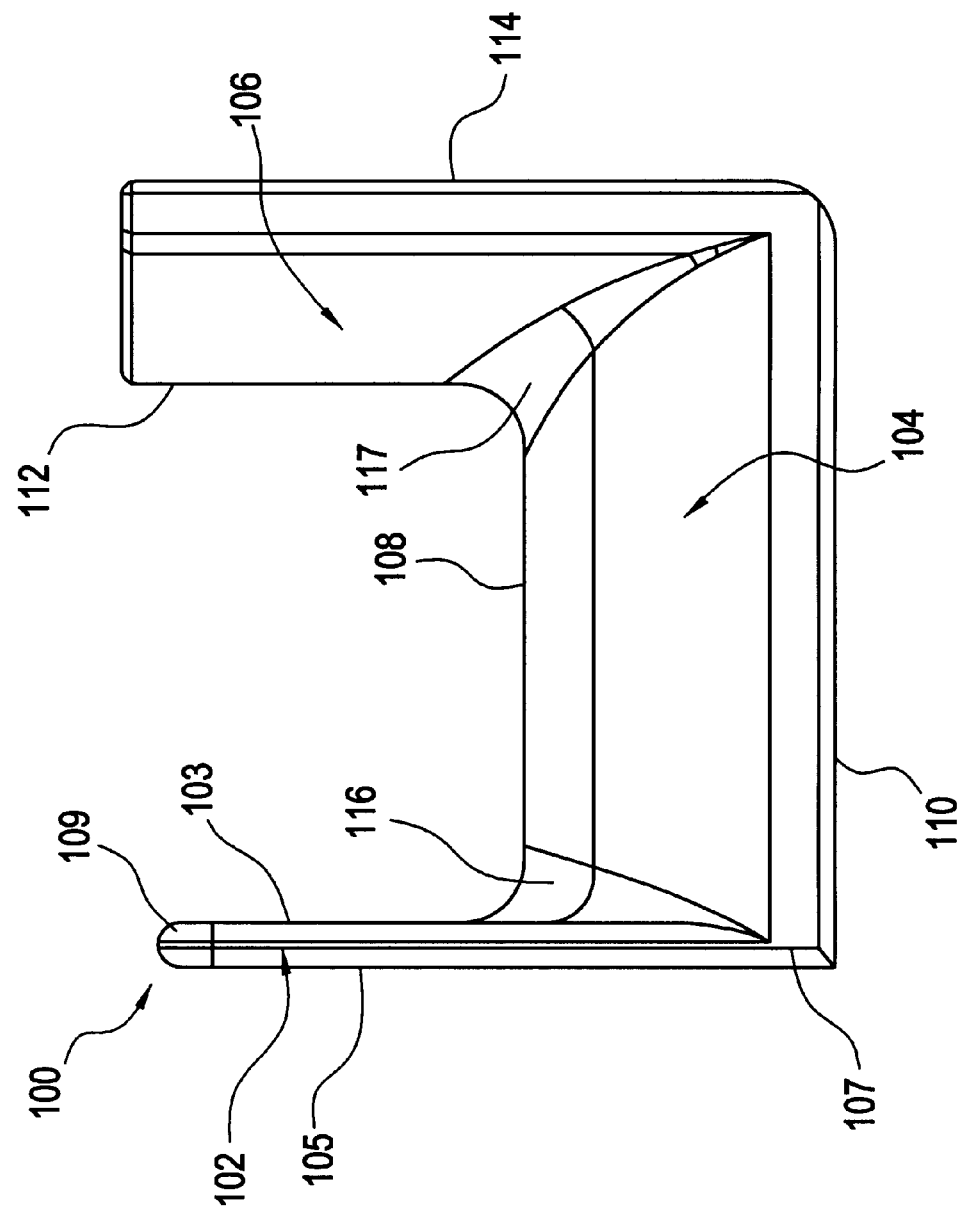
FIG. 3 is a side plan view of a bend radius guide in an exemplary embodiment of the invention.

FIG. 3 is a side plan view of a bend radius guide, shown generally at 100, as an exemplary embodiment of the present invention. Bend radius guide 100 includes a first member 102, a second member 104, and a third member 106. First member 102 and third member 106 are arranged substantially parallel to each other and are rigidly joined substantially perpendicular to second member 104 such that an approximate U-shape is formed. First member 102 is a thin trapezoidal solid with inner surface 103 and outer surface 105. First member 102 has fixed end 107 and beveled end 109. Fixed end 107 is joined substantially perpendicular to second member 104. Beveled end 109 is free-standing and at an angle with respect to fixed end 107 (see FIG. 6). Second member 104 is an arcuate shape having a radius to prevent signal degradation in fiber optic cable passing over the second member 104. In an exemplary embodiment, the radius of second member 104 is greater than the minimum bend radius of the cable to be used with the bend radius guide 100. Second member 104 includes convex inner surface 108 and concave outer surface 110. Third member 106 is an arcuate shape having a radius to prevent signal degradation in fiber optic cable passing over the second member 104. In an exemplary embodiment, the radius of third member 106 is greater than the minimum bend radius of the cable to be used with the bend radius guide 100. Third member 106 includes convex inner surface 112 and concave outer surface 114. Third member 106 extends further from second member 104 than does first member 102. Second member 104 contains contoured surfaces 116 and 117 that abut first member 102 and third member 106, respectfully, to maintain an arcuate shape at the joints of said members.

Figure 4:
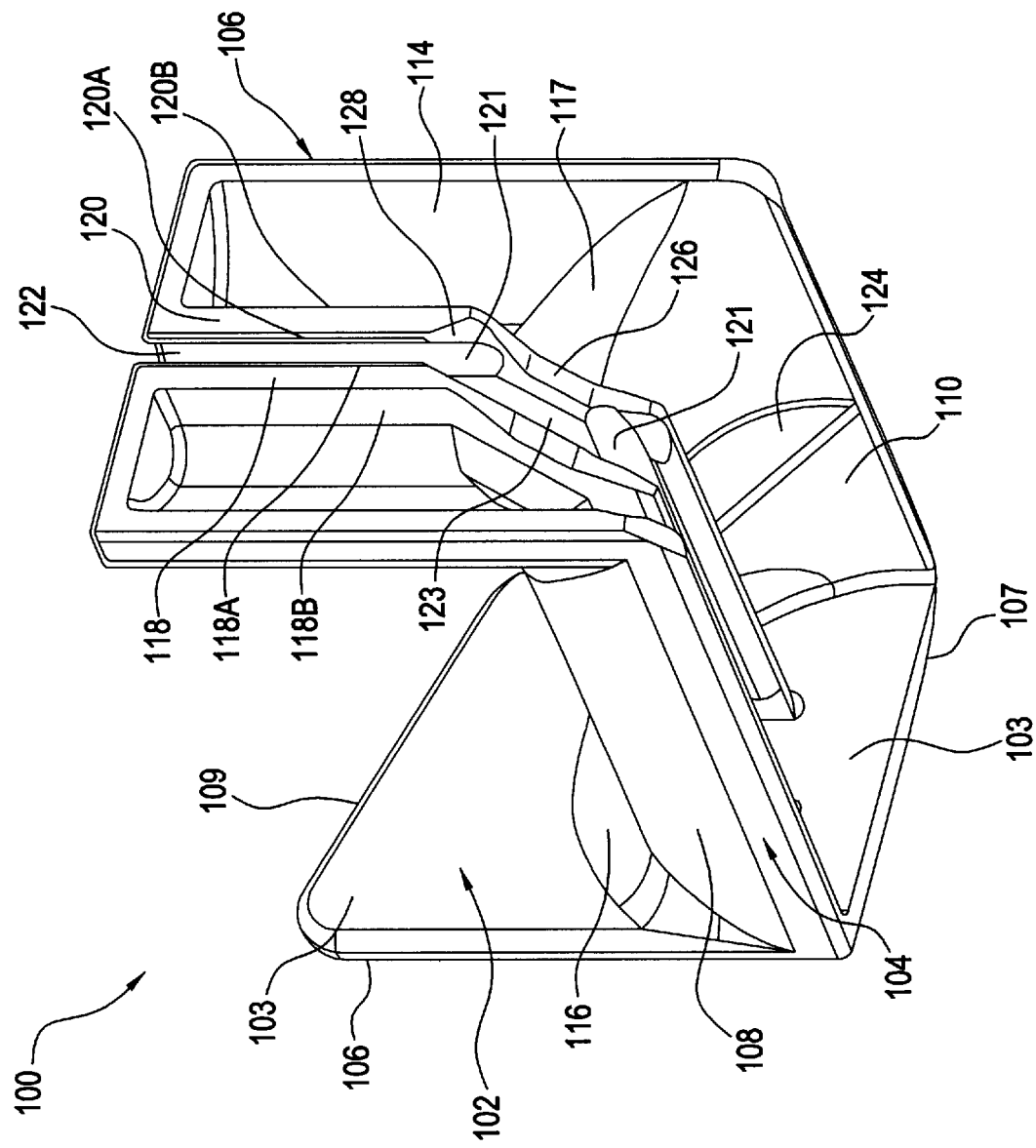
FIG. 4 is a perspective view of the bend radius guide of FIG. 3.

FIG. 4 is a perspective view of the bend radius guide 100 of FIG. 3. A first flange 118 and a second flange 120 are mounted continuously to outer surface 114, contoured surface 117, and outer surface 110. First flange 118 and second flange 120 are positioned parallel to each other. First flange 118 has interior and exterior surfaces 118A and 118B, respectfully. Interior surface 118A has a semi-cylindrical cut-out 119 (see FIG. 5). Second flange 120 has interior and exterior surfaces 120A and 120B, respectfully. Interior surface 120A has a semi-cylindrical cut-out 121. Channel 122 is formed by the interfacing of semi-cylindrical cut-outs 119 and 121. Groove 123 is formed by the interfacing of the remaining portions of interior surfaces 118A and 120A. First and second flanges 118 and 120 have cut-out areas 126 and tapered sections 128 at contoured surface 117 to aid in installing bend radius guide 100 on a distribution enclosure as discussed in more detail herein. First and second flanges 118 and 120 terminate at inner surface 103 of first member 102. First and second flanges 118 and 120 also terminate at and bore through top surface 130 of member 106. Support members 124 are mounted on outer surface 110 perpendicular and adjoined to first and second flanges 118 and 120 to give support to said flanges and to second member 104.

Figure 5:
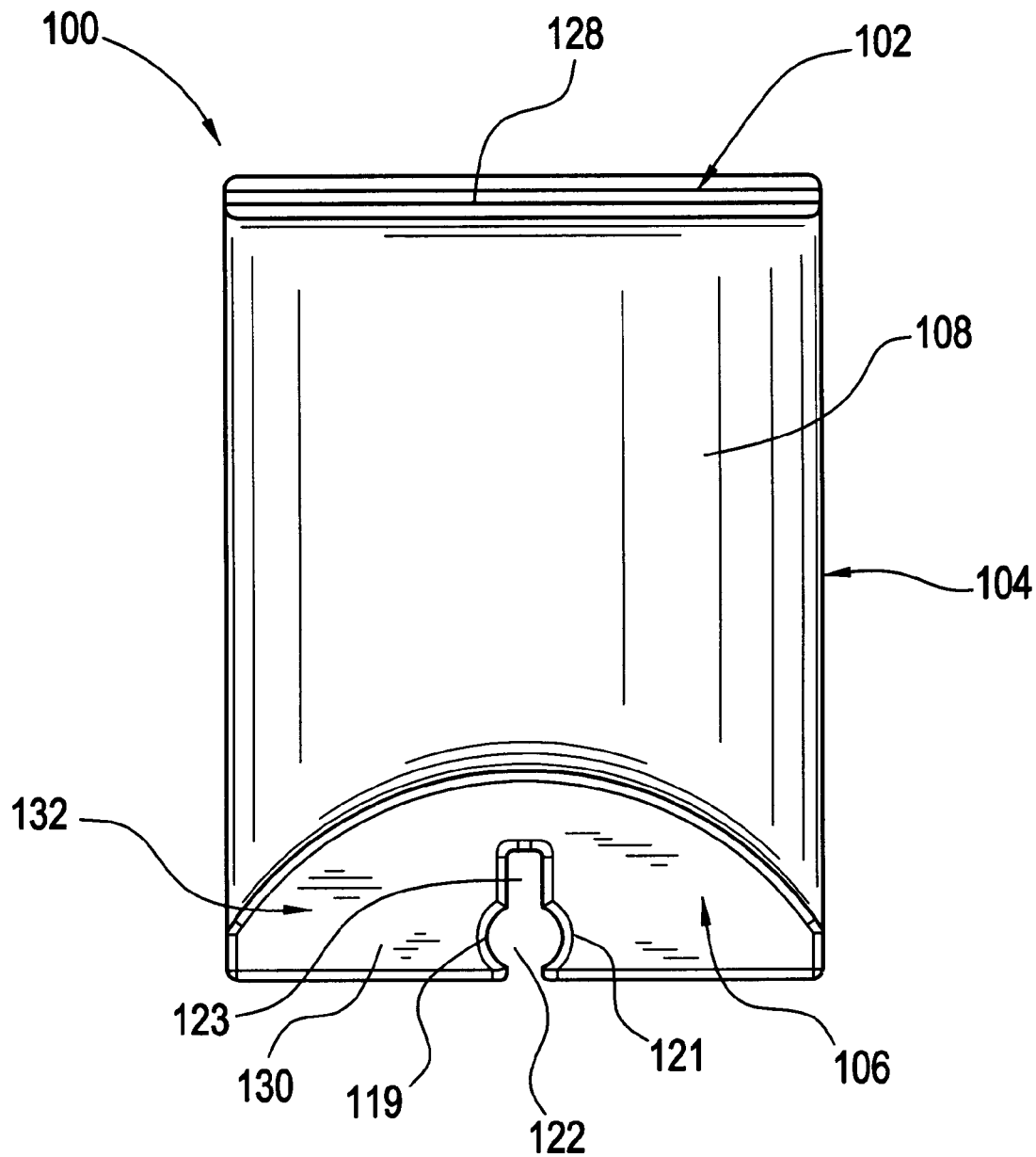
FIG. 5 is a side plan view of the bend radius guide of FIG. 3.

FIG. 5 is a top plan view of bend radius guide 100 depicting the convex inner surface 108 of second member 104 and top surfaces, 128 and 130, of first member 102 and third member 106, respectfully. Top surface 128 is substantially rectangular in shape. Top surface 130 is substantially semi-cylindrical in shape. Channel 122 and groove 123 bore through top surface 130 to create notch 132. Notch 132, channel 122, and groove 123 combine to facilitate in the installation of bend radius guide 100 onto cable distribution enclosures as discussed in further detail below. Groove 123 is substantially rectangular in shape and runs with cylindrical channel 122 traversing outer surface 114, contoured surface 117, and outer surface 110 and then terminates at inner surface 103 of first member 102.

Figure 6:
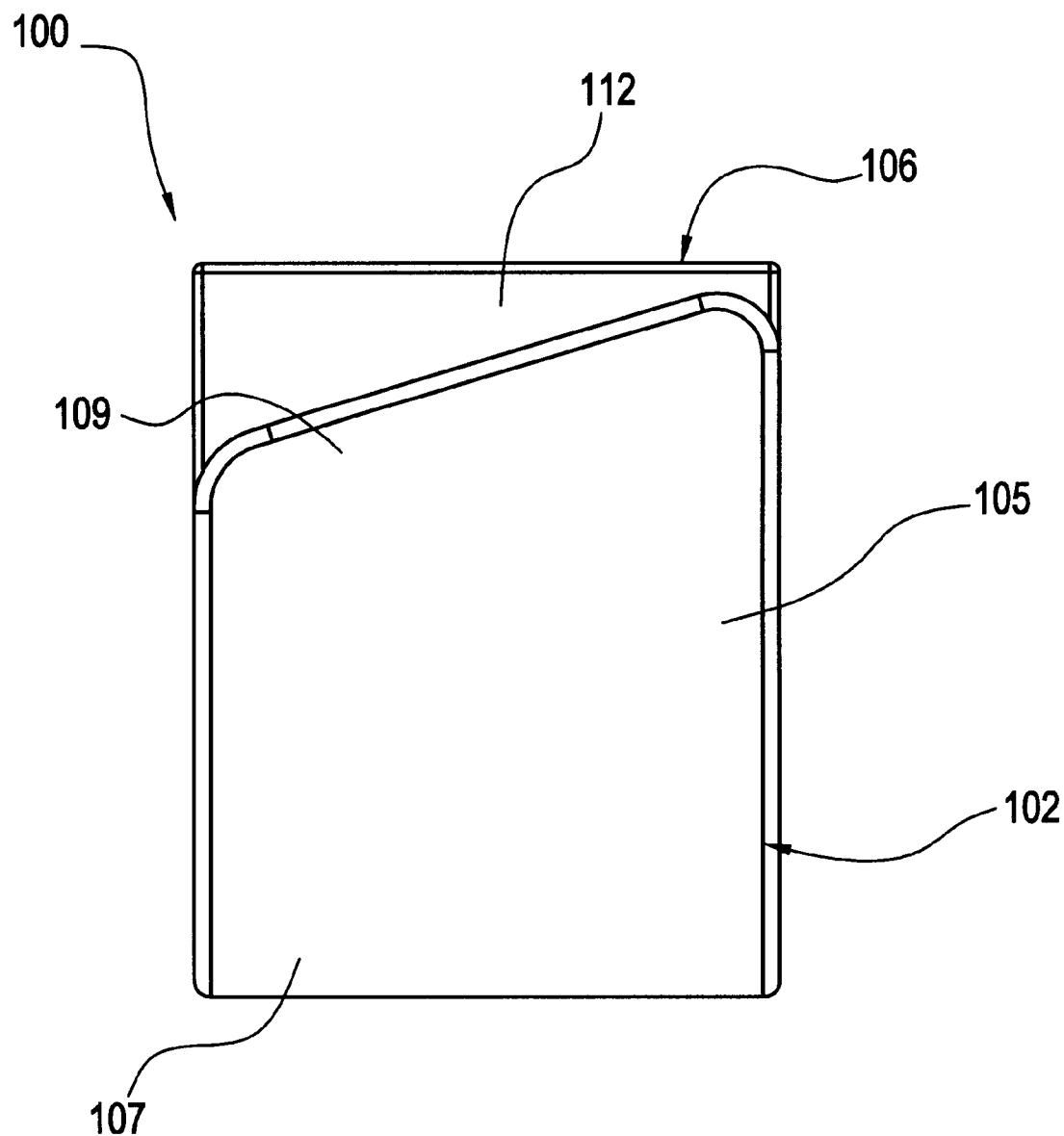
FIG. 6 is a front plan view of bend radius guide.

FIG. 6 is a side plan view of bend radius guide 100 showing outer surface 105 of first member 102 and inner surface 112 of third member 106. First member 102 is shorter in length than third member 106 and the distal end of first member 102 that is not joined to second member 104 is beveled to facilitate the concurrently use of two bend radius guides, as is discussed further below.

Figure 7:
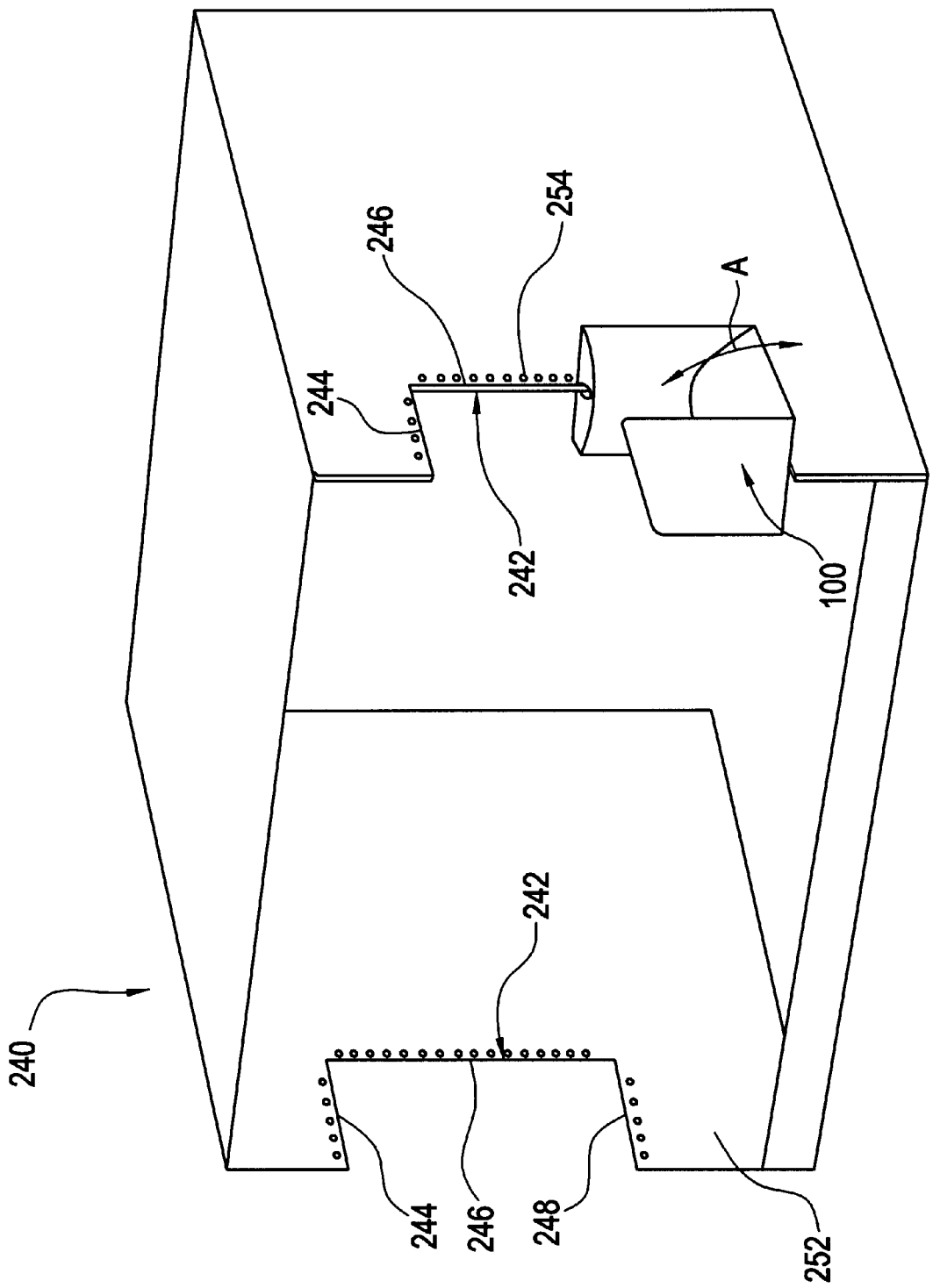
FIG. 7 is a perspective view of a bend radius guide installed on an exemplary cable distribution enclosure.

The use of bend radius guide 100 is now discussed. FIG. 7 shows bend radius guide 100 installed on a cable distribution enclosure 240. Cable distribution enclosure 240 has cable openings 242 through which cable enters and/or exits said enclosure. Cable openings 242 are substantially rectangular in shape and have a first edge 244, a second edge 246, a third edge 248. Edges 244, 246, and 248 are comprised of the casing 252 of cable distribution enclosure 240. Casing 252 has a plurality of protuberances 254 which are adjacent to and parallel to edges 244, 246, and 248.

An exemplary installation of bend radius guide 100 to cable distribution enclosure 240 begins by aligning bend radius guide 100 such that second member 104 abuts either edge 244 or 248, depending on desired placement, at interior surfaces 118A and 120A of first flange 118 and second flange 120, respectfully. Bend radius guide 100 is further positioned such that third member 106 abuts edge 246 at interior surfaces 118A and 120A of first flange 118 and second flange 120, respectfully.

Next, a force is applied perpendicular to inner surface 108 of second member 104 causing edge 244 or 248, depending upon placement of guide 100, to enter channel 122. Additional force is placed in the same direction causing edge 244 or 248, depending upon placement of guide 100, to enter groove 123, simultaneously causing protuberances 254 to enter channel 122 snapping second member 104 onto cable distribution enclosure 240. Then, a force is applied perpendicular to inner surface 112 of third member 106 causing edge 246 to enter channel 122. Additional force is applied in the same direction causing edge 246 to enter groove 123 simultaneously causing protuberances 254 to enter channel 122 snapping third member 106 onto cable distribution enclosure 240. Bend radius guide 100 is now installed and may be used to accommodate cables entering or exiting cable distribution enclosure 240. In the position shown in FIG. 7, the bend radius guide 100 is primarily used for guiding cables entering or existing enclosure 240 below the enclosure as shown by arrow A. Of course, the bend radius guide 100 may be mounted such that second member 104 is placed against edge 244 for guiding cables entering or exiting enclosure 240 from above the enclosure.

Bend radius guide 100 installed on cable distribution enclosure 240, as described, provides multi-directional control of bend radius thus preventing the deleterious effects of microbending as discussed above. The directions of bend radius control provided by the installation of guide 100 correspond to the inner surfaces of said guide. The convex inner surface 108 of second member 104 protects cables entering or exiting cable distribution enclosure 240 against microbending in a direction substantially perpendicular to either edge 248 or 244, depending on the chosen installation arrangement. Convex inner surface 112 of third member 106 provides bend radius control for cables entering or exiting enclosure 240 in a direction substantially perpendicular to edge 246. Contoured surface 117 provides bend radius control for those cables entering or exiting enclosure 240 in a direction substantially bisecting the angle formed by the intersection of second member 104 and third member 106. Contoured surface 116 provides bend radius control for those cables entering or exiting enclosure 240 in a direction substantially bisecting the angle formed by first member 102 and second member 104. First member 102 acts as a collar preventing cables entering or exiting cable distribution enclosure 240 from slipping outside of bend radius guide 100.

Additional directions of bend radius control are provided when two bend radius guides 100 are installed concurrently in opening 242 of cable distribution enclosure 240 as is depicted in FIG. 8. An exemplary method of installation is provided as follows. A first bend radius guide 100 is positioned such that second member 104 abuts edge 248 and third member 106 abuts edge 246 at interior surfaces 118A and 120A of first and second flanges 118 and 120, respectfully. Force is applied substantially perpendicular to second member 104 causing edge 248 to enter channel 122 and then subsequently enter groove 123, simultaneously causing protuberances 254 to enter channel 122 snapping second member 104 onto cable distribution enclosure 240. Next, a force is applied substantially perpendicular to third member 106 causing edge 246 to enter channel 122 and then subsequently enter groove 123, simultaneously causing protuberances 254 to enter channel 122 snapping third member 106 onto cable distribution enclosure 240. First bend radius guide 100 is now properly installed on cable distribution enclosure 240.

Referring to FIG. 8, a second bend radius guide 100 is positioned such that second member 104 abuts edge 244 and third member 106 abuts edge 246 at interior surfaces 118A and 120A of first and second flanges 118 and 120, respectfully. Force is applied substantially perpendicular to second member 104 causing edge 244 to enter channel 122 and then subsequently enter groove 123, simultaneously causing protuberances 254 to enter channel 122 snapping second member 104 onto cable distribution enclosure 240. Next, a force is applied substantially perpendicular to third member 106 causing edge 246 to enter channel 122 and then subsequently enter groove 123, simultaneously causing protuberances 254 to enter channel 122 snapping third member 106 onto cable distribution enclosure 240. Second bend radius guide 100 is installed on cable distribution enclosure 240 on edges 246 and 244 adjacent to the first bend radius guide 100 so that the ends of third members 106 abut against each other as shown in FIG. 8.

Bend radius guides, concurrently installed, can retain and provide bend radius control for a plurality of fiber cables. Concurrent installation provides multi-directional bend radius control beyond that offered by installation of a single bend radius guide. The directions of bend radius control provided by concurrent installation corresponds to the inner surfaces of the concurrently installed bend radius guides. Inner surfaces 108 of concurrently installed bend radius guides 100 provide bend radius control in directions parallel to edge 246 of said enclosure. Inner surfaces 112 of concurrently installed bend radius guides 100 provide bend radius control in directions substantially perpendicular to edge 246 of said enclosure. Contoured surfaces 117 of concurrently installed bend radius guides 100 provide bend radius control in a direction substantially bisecting the angle created by the intersection of second member 104 and third member 106. Contoured surfaces 116 of bend radius guides 100 in FIG. 8 provide bend radius control in a direction substantially bisecting the angle created by the intersection of first member 102 and second member 104.

First members 102 of concurrently installed bend radius guides 100 properly retain and allow access to cables entering or exiting a cable distribution enclosure 240. First members 102 act as a collar that prevents cables entering or exiting cable distribution enclosure 240 from slipping outside of bend radius guides 100. Beveled ends 109 of first members 102 are juxtaposed and do not meet when two bend radius guides 100 are installed as described above with reference to FIG. 8. The resulting slot 256 is angled relative to fixed ends 107 of first members 102. Slot 256 allows access to individual cables without requiring removal of either concurrently installed bend radius guide 100. Slot 256 is angled to prevent unintended cable withdrawal. A plurality of cables retained by a concurrently installed bend radius guide may be accessed by removing one bend radius guide. Bend radius guide 100 is removed simply by applying a force by hand on outer surfaces 110 and 114, opposite that used in the installation process, until bend radius guide 100 snaps free.

What is claimed is:

1. A device for retaining fiber optic cable, the device comprising:
    a first member with an inner surface and an outer surface;
    a second member of arcuate shape with a convex inner surface and a concave outer surface;
    a third member of arcuate shape with a convex inner surface and a concave outer surface and a top surface;
    a first flange and a second flange mounted parallel to each other on said outer surfaces of said second and third members;
    wherein said first member and said third member are joined to said second member to form a U-shape.

2. The device of claim 1 wherein said first flange and said second flange each contain an interior surface and an exterior surface.

3. The device of claim 2 wherein said interior surfaces include a semi-cylindrical cut-out.

4. The device of claim 3 wherein said first and second flanges are arranged such that said interior surfaces are positioned with opposing semi-cylindrical cut-outs creating a channel and the remainder of the positioned interior surfaces creating a groove.

5. The device of claim 1 wherein said first flange and said second flange terminate at the inner surface of said first member and at the top surface of said third member.

6. The device of claim 1 wherein said first flange and said second flange include a cut out area where said flanges traverse said concave outer surfaces.

7. The device of claim 1 wherein said first member comprises a fixed end and a beveled end.

8. The device of claim 7 wherein said fixed end is joined substantially perpendicular to said second member.

9. The device of claim 7 wherein said beveled end is angled relative to said fixed end.

10. The device of claim 1 wherein said second member further includes a first contoured surface and a second contoured surface.

11. The device of claim 10 wherein said first contoured surface and said second contoured surface are mounted at opposite ends of said second member abutting said first member and said third member.

12. The device of claim 1 wherein said second member further includes a first support member and a second support member.

13. The device of claim 12 wherein said first support member is mounted on said outer surface of said second member perpendicular to and abutting an exterior surface of said first flange.

14. The device of claim 13 wherein second support member is mounted opposite said first support member on said outer surface of said second member perpendicular to and abutting an exterior surface of said second flange.

15. The device of claim 1 wherein said top surface of said third member is substantially semi-cylindrical in shape.

16. The device of claim 1 wherein said top surface of said third member further includes a notch.

17. A cable distribution enclosure including:
    a first bend radius guide mounted to the cable distribution enclosure, said first bend radius guide including a first member, a second member with a concave outer surface, and a third member with a concave outer surface, wherein said first member and said third member are joined to said second member to form a general U-shape;
    a second bend radius guide mounted to the cable distribution enclosure, said second bend radius guide including a fourth member, a fifth member with a concave outer surfaces, and a sixth member having a concave outer surface, wherein said fourth member and said sixth member are joined to said fifth member to form a general U-shape;
    said first bend radius guide and said second bend radius guide are mounted to the cable distribution enclosure so that said third member abuts against said sixth member.

* * * * *